(12) United States Patent
Jones et al.

(10) Patent No.: US 12,339,721 B2
(45) Date of Patent: *Jun. 24, 2025

(54) TRANSMISSION OF PULSE POWER AND DATA OVER A WIRE PAIR

(71) Applicant: Cisco Technology, Inc., San Jose, CA (US)

(72) Inventors: Chad M. Jones, Doylestown, OH (US); Joel Richard Goergen, Soulsbyville, CA (US); George Allan Zimmerman, Manhattan Beach, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/643,013

(22) Filed: Apr. 23, 2024

(65) Prior Publication Data
US 2024/0272690 A1    Aug. 15, 2024

Related U.S. Application Data

(60) Continuation of application No. 18/175,668, filed on Feb. 28, 2023, now Pat. No. 12,061,506, which is a
(Continued)

(51) Int. Cl.
*H03M 13/00* (2006.01)
*G06F 1/26* (2006.01)
(Continued)

(52) U.S. Cl.
CPC .......... *G06F 1/266* (2013.01); *H03M 13/154* (2013.01); *H04L 1/0057* (2013.01); *H04L 12/10* (2013.01)

(58) Field of Classification Search
CPC ... H04L 1/0057; H04L 25/4902; H04L 27/22; H03M 13/154; H03M 13/373; H03M 13/00; G06F 1/26; G06F 1/266
See application file for complete search history.

(56) References Cited

U.S. PATENT DOCUMENTS 3,335,324 A    8/1967    Buckeridge
3,962,529 A    6/1976    Kubo
(Continued)

FOREIGN PATENT DOCUMENTS

CN    1209880 C    7/2005
CN    1815459 A    8/2006
(Continued)

OTHER PUBLICATIONS

Audio/video, Information and Communication Technology Equipment—Part 1: Safety requirements, International Standard, IEC 62368-1, Edition 2.0, Feb. 2014, ISBN 978-2-8322-1405-3, pp. 1-680.
(Continued)

*Primary Examiner* — Esaw T Abraham

(57) ABSTRACT

In one embodiment, a method includes applying Forward Error Correction (FEC) to data at power sourcing equipment, transmitting the data and pulse power over a wire pair to a powered device, identifying data transmitted during power transitions between a pulse power on time and a pulse power off time in the pulse power at the powered device, and applying FEC decoding to at least a portion of the data based on said identified power transitions.

20 Claims, 11 Drawing Sheets

Related U.S. Application Data continuation of application No. 17/340,245, filed on Jun. 7, 2021, now Pat. No. 11,630,497, which is a division of application No. 16/255,657, filed on Jan. 23, 2019, now Pat. No. 11,061,456.

(51) Int. Cl.
*H03M 13/15* (2006.01)
*H04L 1/00* (2006.01)
*H04L 12/10* (2006.01)

(56) References Cited

U.S. PATENT DOCUMENTS

| | | |
|---|---|---|
| 4,097,692 A | 6/1978 | Felix |
| 4,811,187 A | 3/1989 | Nakajima et al. |
| 4,997,388 A | 3/1991 | Dale et al. |
| 5,159,684 A | 10/1992 | Kroll et al. |
| 5,652,893 A | 7/1997 | Ben-Meir et al. |
| 6,008,631 A | 12/1999 | Johari |
| 6,220,955 B1 | 4/2001 | Posa |
| 6,259,745 B1 | 7/2001 | Chan |
| 6,295,356 B1 | 9/2001 | De Nicolo |
| 6,448,672 B1 | 9/2002 | Voegeli et al. |
| 6,636,538 B1 | 10/2003 | Stephens |
| 6,685,364 B1 | 2/2004 | Brezina et al. |
| 6,756,881 B2 | 6/2004 | Bateman et al. |
| 6,775,799 B1 | 8/2004 | Giorgetta et al. |
| 6,784,790 B1 | 8/2004 | Lester |
| 6,826,368 B1 | 11/2004 | Koren et al. |
| 6,855,881 B2 | 2/2005 | Khoshnood |
| 6,860,004 B2 | 3/2005 | Hirano et al. |
| 6,892,336 B1 | 5/2005 | Giorgetta et al. |
| 7,073,117 B1 | 7/2006 | Ireland et al. |
| 7,325,150 B2 | 1/2008 | Lehr et al. |
| 7,417,443 B2 | 8/2008 | Admon et al. |
| 7,420,355 B2 | 9/2008 | Liu et al. |
| 7,490,996 B2 | 2/2009 | Sommer |
| 7,492,059 B2 | 2/2009 | Peker et al. |
| 7,509,505 B2 | 3/2009 | Randall et al. |
| 7,519,124 B2 | 4/2009 | Oksman et al. |
| 7,564,904 B2 | 7/2009 | Isachar et al. |
| 7,566,987 B2 | 7/2009 | Black et al. |
| 7,580,469 B2 | 8/2009 | Yonesi et al. |
| 7,583,703 B2 | 9/2009 | Bowser et al. |
| 7,589,435 B2 | 9/2009 | Metsker et al. |
| 7,593,747 B1 | 9/2009 | Karam et al. |
| 7,603,570 B2 | 10/2009 | Schindler et al. |
| 7,616,465 B1 | 11/2009 | Vinciarelli |
| 7,805,657 B2 | 9/2010 | Kappler et al. |
| 7,813,646 B2 | 10/2010 | Furey |
| 7,835,389 B2 | 11/2010 | Yu et al. |
| 7,854,634 B2 | 12/2010 | Filipon et al. |
| 7,881,072 B2 | 2/2011 | DiBene, II et al. |
| 7,915,761 B1 | 3/2011 | Jones et al. |
| 7,921,307 B2 | 4/2011 | Karam et al. |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,068,937 B2 | 11/2011 | Eaves |
| 8,081,589 B1 | 12/2011 | Gilbrech et al. |
| 8,184,525 B2 | 5/2012 | Karam |
| 8,276,397 B1 | 10/2012 | Carlson et al. |
| 8,279,883 B2 | 10/2012 | Diab et al. |
| 8,310,089 B2 | 11/2012 | Schindler et al. |
| 8,319,627 B2 | 11/2012 | Chan et al. |
| 8,345,439 B1 | 1/2013 | Goergen et al. |
| 8,350,538 B2 | 1/2013 | Cuk |
| 8,358,893 B1 | 1/2013 | Sanderson et al. |
| 8,386,820 B2 | 2/2013 | Diab |
| 8,638,008 B2 | 1/2014 | Baldwin et al. |
| 8,700,923 B2 | 4/2014 | Fung |
| 8,712,324 B2 | 4/2014 | Corbridge et al. |
| 8,750,710 B1 | 6/2014 | Hirt et al. |
| 8,768,528 B2 | 7/2014 | Millar et al. |
| 8,781,637 B2 | 7/2014 | Eaves |
| 8,787,775 B2 | 7/2014 | Earnshaw |
| 8,793,511 B1 | 7/2014 | Bishara |
| 8,829,917 B1 | 9/2014 | Lo et al. |
| 8,836,228 B2 | 9/2014 | Xu et al. |
| 8,842,430 B2 | 9/2014 | Hellriegel et al. |
| 8,849,471 B2 | 9/2014 | Daniel et al. |
| 8,898,446 B2 | 11/2014 | Ronen et al. |
| 8,966,747 B2 | 3/2015 | Vinciarelli et al. |
| 8,971,399 B2 | 3/2015 | Kwon et al. |
| 9,001,881 B2 | 4/2015 | Okamura et al. |
| 9,024,473 B2 | 5/2015 | Huff et al. |
| 9,184,795 B2 | 11/2015 | Eaves |
| 9,189,043 B2 | 11/2015 | Vorenkamp et al. |
| 9,273,906 B2 | 3/2016 | Goth et al. |
| 9,319,101 B2 | 4/2016 | Lontka |
| 9,321,362 B2 | 4/2016 | Woo et al. |
| 9,373,963 B2 | 6/2016 | Kuznetsov |
| 9,419,436 B2 | 8/2016 | Eaves et al. |
| 9,467,177 B1 | 10/2016 | Dabiri |
| 9,484,771 B2 | 11/2016 | Braylovskiy et al. |
| 9,510,479 B2 | 11/2016 | Vos |
| 9,531,551 B2 | 12/2016 | Balasubramanian et al. |
| 9,590,811 B2 | 3/2017 | Hunter, Jr. et al. |
| 9,618,714 B2 | 4/2017 | Murray |
| 9,640,998 B2 | 5/2017 | Dawson |
| 9,654,253 B1 | 5/2017 | Smith et al. |
| 9,665,148 B2 * | 5/2017 | Hamdi ............. H04L 12/40045 |
| 9,693,244 B2 | 6/2017 | Maruhashi et al. |
| 9,734,940 B1 | 8/2017 | McNutt et al. |
| 9,768,978 B2 * | 9/2017 | Coenen ............... H02J 7/00047 |
| 9,819,444 B2 | 11/2017 | Shen et al. |
| 9,853,689 B2 | 12/2017 | Eaves |
| 9,874,930 B2 | 1/2018 | Vavilala et al. |
| 9,882,656 B2 * | 1/2018 | Sipes, Jr. ................ H04B 10/40 |
| 9,891,678 B2 * | 2/2018 | Butcher .................. G06F 1/266 |
| 9,893,521 B2 | 2/2018 | Lowe et al. |
| 9,948,198 B2 | 4/2018 | Imai |
| 9,979,370 B2 | 5/2018 | Xu |
| 9,985,600 B2 | 5/2018 | Xu et al. |
| 10,007,628 B2 | 6/2018 | Pitigoi-Aron et al. |
| 10,028,417 B2 | 7/2018 | Schmidtke et al. |
| 10,075,189 B2 * | 9/2018 | Li ....................... H03M 13/353 |
| 10,128,764 B1 | 11/2018 | Vinciarelli |
| 10,218,492 B2 | 2/2019 | Sengoku |
| 10,248,178 B2 * | 4/2019 | Brooks ................ G06F 1/3265 |
| 10,263,526 B2 | 4/2019 | Sandusky et al. |
| 10,281,513 B1 | 5/2019 | Goergen et al. |
| 10,374,813 B2 * | 8/2019 | Sheffield ............. H04L 41/0659 |
| 10,407,995 B2 | 9/2019 | Moeny |
| 10,439,432 B2 | 10/2019 | Eckhardt et al. |
| 10,468,879 B2 | 11/2019 | Eaves |
| 10,541,543 B2 | 1/2020 | Eaves |
| 10,541,758 B2 | 1/2020 | Goergen et al. |
| 10,571,758 B2 * | 2/2020 | Yueh ................... G02F 1/13338 |
| 10,574,391 B2 | 2/2020 | Schmidtke et al. |
| 10,579,391 B2 * | 3/2020 | Schlanger ............ G06F 9/4401 |
| 10,631,443 B2 | 4/2020 | Byers et al. |
| 10,639,587 B2 | 5/2020 | Lu |
| 10,671,146 B2 | 6/2020 | Wendt et al. |
| 10,714,930 B1 | 7/2020 | Weiss et al. |
| 10,735,105 B2 | 8/2020 | Goergen et al. |
| 10,790,997 B2 | 9/2020 | Jones et al. |
| 11,055,615 B2 | 7/2021 | Litichever et al. |
| 11,061,456 B2 | 7/2021 | Jones et al. |
| 11,387,852 B2 | 7/2022 | Banin et al. |
| 11,444,791 B2 | 9/2022 | Jones et al. |
| 2001/0024373 A1 | 9/2001 | Cuk |
| 2002/0126967 A1 | 9/2002 | Panak et al. |
| 2004/0000816 A1 | 1/2004 | Khoshnood |
| 2004/0033076 A1 | 2/2004 | Song et al. |
| 2004/0043651 A1 | 3/2004 | Bain et al. |
| 2004/0073703 A1 | 4/2004 | Boucher et al. |
| 2004/0264214 A1 | 12/2004 | Xu et al. |
| 2005/0197018 A1 | 9/2005 | Lord |
| 2005/0268120 A1 | 12/2005 | Schindler et al. |
| 2006/0202109 A1 | 9/2006 | Delcher et al. |
| 2006/0209875 A1 | 9/2006 | Lum et al. |

(56) References Cited

U.S. PATENT DOCUMENTS

| | | |
|---|---|---|
| 2007/0103168 A1 | 5/2007 | Batten et al. |
| 2007/0143508 A1 | 6/2007 | Linnman |
| 2007/0236853 A1 | 10/2007 | Crawley |
| 2007/0263675 A1 | 11/2007 | Lum et al. |
| 2007/0284941 A1 | 12/2007 | Robbins |
| 2007/0284946 A1 | 12/2007 | Robbins |
| 2007/0288125 A1 | 12/2007 | Quaratiello |
| 2007/0288771 A1 | 12/2007 | Robbins |
| 2008/0054720 A1 | 3/2008 | Lum et al. |
| 2008/0166715 A1 | 7/2008 | Hillis et al. |
| 2008/0198635 A1 | 8/2008 | Hussain et al. |
| 2008/0229120 A1 | 9/2008 | Diab |
| 2008/0310067 A1 | 12/2008 | Diab et al. |
| 2009/0027033 A1 | 1/2009 | Diab |
| 2010/0061127 A1 | 3/2010 | Katou et al. |
| 2010/0077239 A1 | 3/2010 | Diab et al. |
| 2010/0117808 A1 | 5/2010 | Karam |
| 2010/0171602 A1 | 7/2010 | Kabbara et al. |
| 2010/0190384 A1 | 7/2010 | Lanni |
| 2010/0237846 A1 | 9/2010 | Vetteth |
| 2010/0290190 A1 | 11/2010 | Chester et al. |
| 2011/0007664 A1 | 1/2011 | Diab et al. |
| 2011/0057612 A1 | 3/2011 | Taguchi et al. |
| 2011/0083824 A1 | 4/2011 | Rogers |
| 2011/0228578 A1 | 9/2011 | Serpa et al. |
| 2011/0266867 A1 | 11/2011 | Schindler et al. |
| 2011/0290497 A1 | 12/2011 | Stenevik |
| 2012/0043935 A1 | 2/2012 | Dyer et al. |
| 2012/0064745 A1 | 3/2012 | Ottliczky |
| 2012/0170927 A1 | 7/2012 | Huang et al. |
| 2012/0201089 A1 | 8/2012 | Barth et al. |
| 2012/0231654 A1 | 9/2012 | Conrad |
| 2012/0287984 A1 | 11/2012 | Lee |
| 2012/0317426 A1 | 12/2012 | Hunter, Jr. et al. |
| 2012/0319468 A1 | 12/2012 | Schneider et al. |
| 2013/0077923 A1 | 3/2013 | Peeters Weem et al. |
| 2013/0079633 A1 | 3/2013 | Peeters Weem et al. |
| 2013/0103220 A1 | 4/2013 | Eaves |
| 2013/0249292 A1 | 9/2013 | Blackwell, Jr. et al. |
| 2013/0272721 A1 | 10/2013 | Van Veen et al. |
| 2013/0329344 A1 | 12/2013 | Tucker et al. |
| 2014/0111180 A1 | 4/2014 | Vladan et al. |
| 2014/0126151 A1 | 5/2014 | Campbell et al. |
| 2014/0129850 A1 | 5/2014 | Paul |
| 2014/0258742 A1 | 9/2014 | Chien et al. |
| 2014/0258813 A1 | 9/2014 | Lusted et al. |
| 2014/0265550 A1 | 9/2014 | Milligan et al. |
| 2014/0372773 A1 | 12/2014 | Heath et al. |
| 2015/0009050 A1 | 1/2015 | Lahr et al. |
| 2015/0078740 A1 | 3/2015 | Sipes, Jr. et al. |
| 2015/0106539 A1 | 4/2015 | Leinonen et al. |
| 2015/0115741 A1 | 4/2015 | Dawson |
| 2015/0207317 A1 | 7/2015 | Radermacher et al. |
| 2015/0215001 A1 | 7/2015 | Eaves |
| 2015/0215131 A1 | 7/2015 | Paul et al. |
| 2015/0333918 A1 | 11/2015 | White, III |
| 2015/0365003 A1 | 12/2015 | Sadwick |
| 2016/0018252 A1 | 1/2016 | Hanson et al. |
| 2016/0020911 A1 | 1/2016 | Sipes, Jr. et al. |
| 2016/0064938 A1 | 3/2016 | Balasubramanian et al. |
| 2016/0111877 A1 | 4/2016 | Eaves et al. |
| 2016/0118784 A1 | 4/2016 | Saxena et al. |
| 2016/0133355 A1 | 5/2016 | Glew et al. |
| 2016/0134331 A1 | 5/2016 | Eaves |
| 2016/0142217 A1 | 5/2016 | Gardner et al. |
| 2016/0188427 A1 | 6/2016 | Chandrashekar et al. |
| 2016/0197600 A1 | 7/2016 | Kuznetsov |
| 2016/0241148 A1 | 8/2016 | Kizilyalli et al. |
| 2016/0262288 A1 | 9/2016 | Chainer et al. |
| 2016/0269195 A1 | 9/2016 | Coenen et al. |
| 2016/0273722 A1 | 9/2016 | Crenshaw |
| 2016/0294500 A1 | 10/2016 | Chawgo et al. |
| 2016/0294568 A1 | 10/2016 | Chawgo et al. |
| 2016/0308683 A1 | 10/2016 | Pischl et al. |
| 2016/0337079 A1 | 11/2016 | Ran |
| 2016/0352535 A1 | 12/2016 | Hiscock et al. |
| 2016/0365967 A1 | 12/2016 | Tu et al. |
| 2017/0041152 A1 | 2/2017 | Sheffield |
| 2017/0041153 A1 | 2/2017 | Picard et al. |
| 2017/0054296 A1 | 2/2017 | Daniel et al. |
| 2017/0110871 A1 | 4/2017 | Foster |
| 2017/0123466 A1 | 5/2017 | Carnevale |
| 2017/0146260 A1 | 5/2017 | Ribbich et al. |
| 2017/0155517 A1 | 6/2017 | Cao |
| 2017/0155518 A1 | 6/2017 | Yang |
| 2017/0164525 A1 | 6/2017 | Chapel et al. |
| 2017/0214236 A1 | 7/2017 | Eaves |
| 2017/0229886 A1 | 8/2017 | Eaves |
| 2017/0234738 A1 | 8/2017 | Ross et al. |
| 2017/0248976 A1 | 8/2017 | Møller et al. |
| 2017/0294966 A1 | 10/2017 | Jia et al. |
| 2017/0325320 A1 | 11/2017 | Wendt et al. |
| 2018/0024964 A1 | 1/2018 | Mao et al. |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello et al. |
| 2018/0102604 A1 | 4/2018 | Keith et al. |
| 2018/0123360 A1 | 5/2018 | Eaves |
| 2018/0188712 A1 | 7/2018 | MacKay |
| 2018/0191513 A1 | 7/2018 | Hess et al. |
| 2018/0254624 A1 | 9/2018 | Son |
| 2018/0313886 A1 | 11/2018 | Mlyniec et al. |
| 2018/0340840 A1 | 11/2018 | Bullock et al. |
| 2019/0064890 A1 | 2/2019 | Donachy et al. |
| 2019/0097457 A1 | 3/2019 | Hazani |
| 2019/0126764 A1 | 5/2019 | Fuhrer |
| 2019/0267804 A1 | 8/2019 | Matan et al. |
| 2019/0272011 A1 | 9/2019 | Goergen et al. |
| 2019/0277899 A1 | 9/2019 | Goergen et al. |
| 2019/0277900 A1 | 9/2019 | Goergen et al. |
| 2019/0278347 A1 | 9/2019 | Goergen et al. |
| 2019/0280895 A1 | 9/2019 | Mather et al. |
| 2019/0304630 A1 | 10/2019 | Goergen et al. |
| 2019/0312751 A1 | 10/2019 | Goergen et al. |
| 2019/0342011 A1 | 11/2019 | Goergen et al. |
| 2019/0363493 A1 | 11/2019 | Sironi et al. |
| 2020/0044751 A1 | 2/2020 | Goergen et al. |
| 2020/0228001 A1 | 7/2020 | Lambert et al. |
| 2020/0295955 A1 | 9/2020 | O'Brien et al. |
| 2022/0190587 A1 | 6/2022 | Eaves et al. |

FOREIGN PATENT DOCUMENTS

| | | |
|---|---|---|
| CN | 101026523 A | 8/2007 |
| CN | 201689347 U | 12/2010 |
| CN | 102142932 A | 8/2011 |
| CN | 104412541 A | 3/2015 |
| CN | 104584481 A | 4/2015 |
| CN | 204836199 U | 12/2015 |
| CN | 205544597 U | 8/2016 |
| CN | 104081237 B | 10/2016 |
| CN | 104412541 B | 5/2019 |
| EP | 1936861 A1 | 6/2008 |
| EP | 2120443 A1 | 11/2009 |
| EP | 2257009 A2 | 12/2010 |
| EP | 2432134 A1 | 3/2012 |
| EP | 2693688 A1 | 2/2014 |
| WO | 9316407 A1 | 8/1993 |
| WO | 2006127916 A2 | 11/2006 |
| WO | 2010053542 A2 | 5/2010 |
| WO | 2014011224 A1 | 1/2014 |
| WO | 2017054030 A1 | 4/2017 |
| WO | 2017167926 A1 | 10/2017 |
| WO | 2018017544 A1 | 1/2018 |
| WO | 2019023731 A1 | 2/2019 |
| WO | 2019212759 A1 | 11/2019 |
| WO | 2020154101 A1 | 7/2020 |
| WO | 2020154103 A1 | 7/2020 |
| WO | 2022081778 A1 | 4/2022 |

(56) References Cited

OTHER PUBLICATIONS

Information Technology Equipment-Safety—Part 1: General Requirements, International Standard, IEC 60950-1, Edition 2.2, May 2013, ISBN 978-2-8322-0820-5, pp. 1-648.
"International Telecommunications Energy Conference: [proceedings] (Full Record)," Library Catalog, https://catalog.oc.gov/vwebv/holdingsInfo?searchId=3810&recPointer=0&recCount=25&searchType=1&bibId=11348322, retrieved from the Internet Feb. 12, 2021, 4 pages.
"Low-voltage Switchgear and Controlgear—Part 1: General Rules," International Standard, Amendment 2, IEC 60947-1, Edition 5.0, Sep. 2014, ISBN 978-2-8322-1798-6, pp. 1-106.
Petition for Post Grant Review of U.S. Pat. No. 10,735,105 [Public] with Exhibits, filed Feb. 16, 2021, PGR 2021-00056, pp. 1-116.
*Voltserver Inc.*, v. *Cisco Systems, Inc.*, "Patent Owner's Preliminary Response to Post Grant Review under 35 U.S.C. 312 and 37 C.F.R. 42.107," United States Patent and Trademark Office, PGR2021-00056, U.S. Pat. No. 10,735,105, 2021, Jun. 2, 2021, 46 pages.
*Voltserver Inc.*, v. *Cisco Systems, Inc.*, "Patent Owners Preliminary Response to Post Grant Review under 35 U.S.C. 312 and 37 C.F.R. 42.107," United States Patent and Trademark Office, PGR2021-00055, U.S. Pat. No. 10,735,105, 2021, Jun. 2, 2021, 51 pages.
*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.
*Voltserver Inc.*, v. *Cisco Technology, Inc.*, "Declaration of David A. Durfee, Ph.D.," United States Patent and Trademark Office, PGR2021-00055, U.S. Pat. No. 10,735,105, Feb. 16, 2021, 340 pages.
*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.
Tanenbaum A.S., "Computer Networks," Voltserver Exhibit 1027, Prentice Hall PTR, Third Edition, Mar. 1996, pp. 1-12.
*Voltserver Inc.*, v. *Cisco Technology, Inc.*, "Decision Denying Institution of Post-Grant Review," United States Patent and Trademark Office, PGR2021-00055, U.S. Pat. No. 10,735,105 B2, Aug. 19, 2021, 25 pages.
Yencheck M.R., et al., "Thermal Modeling of Portable Power Cables," RI9463, 1993, 24 pages.
Zhang K., et al., "Machine Learning-Based Temperature Prediction for Runtime Thermal Management across System Components," IEEE Transactions on Parallel and Distribute, Mar. 2016, pp. 1-15.
Office Action for Canadian Application No. 3125024, dated Dec. 30, 2024, 5 pages.
Adapa R., et al., "Dynamic Thermal Rating of Substation Terminal Equipment," CIGRE, Jan. 2004, 8 Pages.
Alexander, C.K., "Fundamentals of Electric Circuits," Indian Edition, McGraw Hill Education, MATLAB Examples, 2013, pp. 1-37.
Berkeley Lab ETA, "Touch-Safe, High Voltage Digital Electricity Transmission Using Packet Energy Transfer," Vimeo, https://vimeo.com/172469008, Mar. 8, 2016, 8 pages.
Chen H., et al., "Real-Time Temperature Estimation for Power MOSEFETs Considering Thermal Aging Effects," IEEE Transactions on Device and Materials Reliability, Mar. 2014, vol. 14, No. 1, pp. 220-228.
Chen J., et al., "Buck-boost PWM Converters having Two Independently Controlled Switches," 32nd Annual EEE Power Electronics Specialists Conference, Conference Proceedings, Vancouver, Canada, New York, NY: IEEE, US, Jun. 17-21, 2001, vol. 2, pp. 736-741, DOI: 10.1109/PESC.2001.954206, ISBN 978-0-7803-7067-8 paragraph SectionIII, XP010559317.
Cheng K.W.E., et al., "Constant Frequency, Two-Stage Quasiresonant Convertor," Published in: IEE Proceedings B—Electric Power Applications, May 1, 1992, vol. 139, No. 3, pp. 227-237, 1271980 1, XP000292493,the whole document.
"Digital Electricity Gen2 Detailed Installation Manual," Voltserver Digital Electricity, Rev B.1, Nov. 29, 2017, 68 Pages.
Durfee D.A., "Curriculum Vitae," 4 pages.
Eaves S.S., et al., "Network Remote Power Using Packet Energy Transfer," Sep. 2012, 5 Pages, URL: www.voltserver.com.
Eaves S.S., "Network Remote Powering Using Packet Energy Transfer," Proceedings of IEEE International Conference on Telecommunications Energy (INTELEC), Sep. 30, 2012-Oct. 4, 2012, Scottsdale, AZ, pp. 1-5.
Edelstein S., "Updated 2016 Tesla Model S also Gets New 75-kWh Battery Option," Voltserver Exhibit 1018, May 5, 2016, Archived on Jun. 19, pp. 1-3, Retrieved on Feb. 6, 2021, 2016 by Internet Archive Wayback machine at https://web.archive.org/ web/20160619001148/https://www.greencarreports.com/news/1103782_updated-2016-tesla-model-s-also-gets-new-75-kwh-battery-option.
Effects of Current on Human Beings and Livestok—Part 1: General Aspects, Technical Specification, Basic Safety Publication, IEC/TS 60479-1, Edition 4.0, Jul. 2005, ISBN 2-8318-8096-3, pp. 1-122.
"Electrical—Computer Conference Proceedings," Internet Archive WayBack Machine Search for Intelec 2012, Curran Associates, Inc., http://www.proceedings.com/electrical-computer-proceedings.html, 2012, 125 pages.
"E-Link Hybrid Connector—QPC Fiber Optic," QPC Engineered Fiber Optic Solutions, pp. 1-4, [Retrieved on Dec. 21, 2017] Retrieved from URL: http://www.qpcfiber.com/product/connectors/e-link-hybrid-connector/.
English Translation of Office Action in Counterpart Chinese Application No. 202080010019.8, mailed Mar. 3, 2022, 11 Pages.
English Translation of Office Action in Counterpart Chinese Application No. 202080010020.0, mailed Mar. 3, 2022, 15 Pages.
Examination Report in counterpart Indian Application No. 202127029265, mailed May 1, 2023, 5 pages.
Examination Report in counterpart Indian Application No. 202147024800, mailed Jan. 11, 2023, 6 Pages.
Fisher Connectors: "FiberOptic Cable and Connector Solutions," pp. 1-5, [Retrieved on Dec. 21, 2017] Retrieved from URL: https://www.fischerconnectors.com/us/en/products/fiberoptic.
Google, "Data Power Pulse Transition Edge Suspended Patents," retrieved May 12, 2022, pp. 1-3.
Google, "Data Pulses Transition Multiphase Patents," Jan. 19, 2022, pp. 1-3.
Google, "Transmitting Power Voltage Pulses Sequence Alternating On-time Off-time Transition Low-state High-state Superimposing Modulated Data Patents," Jan. 18, 2022, pp. 1-3.
Hall S.H., et al., "High-Speed Digital System Design, A Handbook of Interconnect Theory and Design Practices," Voltserver Exhibit 1030, Aug. 25, Sep. 2000, pp. 1-55.
International Preliminary Report on Patentability in Counterpart International Application No. PCT/US2020/020359, mailed Sep. 23, 2021, 9 Pages.
International Search Report and Written Opinion in Counterpart International Application No. PCT/US2020/020359, mailed May 27, 2020, 10 Pages.
International Preliminary Report on Patentability for International Application No. PCT/US2020/012758, mailed Aug. 5, 2021, 10 Pages.
International Preliminary Report on Patentability for International Application No. PCT/US2020/012801, mailed Aug. 5, 2021, 9 Pages.
International Search Report and Written Opinion for International Application No. PCT/US2020/012758, mailed Apr. 8, 2020, 11 Pages.
International Search Report and Written Opinion for International Application No. PCT/US2020/012801, mailed Apr. 15, 2020, 10 Pages.
"International Telecommunications Energy Conference: [proceedings] (Marc Tags)," Library Catalog, https://catalog.loc.gov/vwebv/staffView?searchId=3877&recPointer=0&recCount=25&searchType=1amp&;bibId=11348322, retrieved from the Internet Feb. 12, 2021,3 pages.
Juniper Networks: "Virtual Chassis Technology Best Practices," Implementation Guide, Jan. 2016, 29 pages, 8010018-009-EN, URL: https://wwwjuniper.net/us/en/local/pdf/implementation-guides/8010018-en.pdf.
Lathi B.P., et al., "Modern Digital and Analog Communication Systems," Fourth Edition, Jan. 2009, pp. 1-15.

(56) References Cited

OTHER PUBLICATIONS

LC Catalog-Browse, https://catalog.loc.gov/vwebv/searchBrowse, retrieved from the Internet Feb. 12, 2021, 1 page.
Lumentum: "Power Over Fiber," 2015, accessed on Sep. 25, 2020, 8 Pages, Retrieved from URL: https://www.lumentum.com/sites/default/files/technical-library-items/poweroverfiber-tn-pv-ae_0.pdf.
Microsemi, "Understanding 802.3at PoE Plus Standard Increases Available Power," Voltserver Exhibit 1033, Jun. 2011, pp. 1-7.
"NFPA 70: National Electrical Code," Voltserver Exhibit 1019, National Fire Protection Association, Voltserver Exhibit 1019, published Sep. 26, 2016, 2017 Edition, pp. 1-881.
Palm Intranet, "Inventor Name Search Result—Chad Jones," May 12, 2022, pp. 1-3.
Palm Intranet, "Inventor Name Search Result—Douglas Arduini," May 12, 2022, pp. 1-2.
Palm Intranet, "Inventor Name Search Result—George Zimmerman," May 12, 2022, pp. 1-2.
Palm Intranet, "Inventor Name Search Result—Joel Goergen," May 12, 2022, pp. 1-3.
Palm Intranet, "Inventor Name Search Result—Richard O'Brien," May 12, 2022, pp. 1-3.
Palm Intranet, "Inventor Name Search Result—Sung Baek," May 12, 2022, pp. 1-3.
Palm Intranet, "Inventor Name Search Result—Jason Potterf," May 12, 2022, 1 page.
"Part VII: A Summary of Commonly Used MARC 21 Fields," Marc, Understanding MARC, https://www.loc.gov/marc//Umb/um07to10.html, retrieved from Internet Feb. 13, 2021, 17 pages.
Petition for Post Grant Review of U.S. Pat. No. 10,735,105 [Public] with Exhibits, filed Feb. 16, 2021, PGR 2021-00055, pp. 1-132.
Pluribus Networks: "Pluribus VirtualWire Solution," Product Overview, PN-PO-VWS-05818, May 2018, 5 pages, URL: https://www.pluribusnetworks.com/assets/Pluribus-VirtualWire-PO-50918.pdf.
Rabe C., et al., "Data Center Power Equipment Thermal Guidelines and Best Practices," ASHRAE Technical Committee (TC) 9.9 Mission Critical Facilities, Data Centers, Technology Spaces, and Electronic Equipment, 2016, pp. 1-60.
Sedra A.S., "Microelectronic Circuits," Oxford, Seventh Edition, Voltserver Exhibit 1031, Jan. 2015, Published on Nov. 14, 2014, pp. 1-38.
Stallings W., "Data and Computer Communications," Voltserver Exhibit 1028, Macmillan Publishing Company, Fourth Edition, Jan. 1994, pp. 1-14.
Stran Technologies: "TFOCA GenX Hybrid 2x2 Fiber Optic—Copper Connector," Contact Strantech, pp. 1-2, [Retrieved on Dec. 21, 2017] Retrieved From URL: https://www.strantech.com/products/tfoca-genx-hybrid-2x2-fiber-optic-copper-connector/.

* cited by examiner

TRANSMISSION OF PULSE POWER AND DATA OVER A WIRE PAIR

STATEMENT OF RELATED APPLICATIONS

The present application is a continuation of U.S. application Ser. No. 18/175,668, filed Feb. 28, 2023, now U.S. Pat. No. 12,061,506, issued Aug. 13, 2024, which is a continuation of U.S. application Ser. No. 17/340,245, filed Jun. 7, 2021, now U.S. Pat. No. 11,630,497, issued Apr. 18, 2023, which is a divisional of U.S. patent application Ser. No. 16/255,657, filed Jan. 23, 2019, now U.S. Pat. No. 11,061,456, issued Jul. 13, 2021. The content of these prior applications are incorporated herein by reference in its entirety.

TECHNICAL FIELD

The present disclosure relates generally to network communications systems, and more particularly, to transmission of pulse power and data.

BACKGROUND

Conventional Ethernet cabling uses four-pair cables to transmit data over networks and deliver low power via Power over Ethernet (POE) with constant voltages under 60 volts. With the growth of Internet of Things (IoT) along with other applications, interest has increased for Single Pair Ethernet (SPE), which provides a more compact and economical solution for delivering low Power over Data Line (PoDL).

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
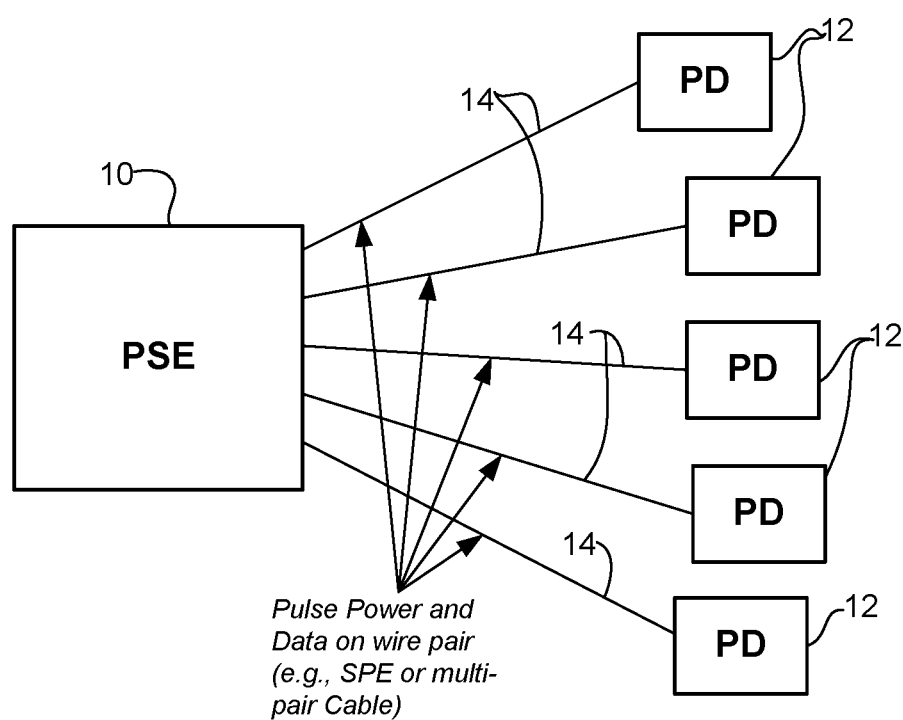
FIG. 1 illustrates an example of a network in which embodiments described herein may be implemented.

In one embodiment, an apparatus generally comprises an interface for transmitting pulse power and data to a powered device over a wire pair and a controller for receiving input identifying power transitions in the pulse power and suspending data transmission during the power transitions.

In one or more embodiments, the controller comprises a buffer for buffering the data based on the identified power transitions. In one or more embodiments, the controller is configured to use the identified power transitions to control a MAC (Media Access Control)/PHY (Physical layer entity) to hold off the data transmission during the identified power transitions. In one or more embodiments, the controller is operable to apply Forward Error Correction (FEC) to the data. In one or more embodiments, the FEC protects data not suspended during the power transitions.

In one or more embodiments, the wire pair comprises a Single Pair Ethernet (SPE) cable. In one or more embodiments, the pulse power and data are transmitted over a cable comprising multiple wire pairs. In one or more embodiments, the pulse power and data are transmitted over two wire pairs and the pulse power is applied at a pair center tap.

In one or more embodiments, each of the power transitions comprises an approximately 0.5 ms window during transition from power on to power off or from power off to power on. In one or more embodiments, the pulse power comprises power over 100 watts. In one or more embodiments, the apparatus is configured to modulate pulses of the pulse power to transmit control plane data to the powered device.

In another embodiment, an apparatus generally comprises an interface for receiving pulse power and data from power sourcing equipment on a wire pair and a controller for receiving input identifying power transitions in the pulse power and processing the data based on the identified power transitions.

In one or more embodiments, the controller marks the data received during the identified power transitions. At least a portion of the marked data may be dropped or retransmitted. In one or more embodiments, FEC is applied to the data at the power sourcing equipment and the controller marks the data received during the identified power transitions for decoding. In one or more embodiments the FEC comprises an erasure-correcting code.

In one or more embodiments, data transmission is suspended during power transitions at the power sourcing equipment and FEC is applied to the data, and the controller comprises a gate and a buffer for use in identifying the data received during the power transitions and reassembling the data.

In one or more embodiments, the apparatus further comprises a decoder for decoding encoded modulation of the pulse power at the power sourcing equipment for transmission of control plane data.

In yet another embodiment, a method generally comprises applying FEC to data at power sourcing equipment, transmitting the data and pulse power over a wire pair to a powered device, identifying data transmitted during power transitions in the pulse power at the powered device, and applying FEC decoding to at least a portion of the data based on the identified power transitions.

In one or more embodiments, the method further comprises suspending transmission of the data during power transitions at the power sourcing equipment, buffering the data transmitted during the identified power transitions at the powered device, and decoding the FEC for remaining data.

In one or more embodiments, the method further comprises marking the data transmitted during the identified pulse power transitions to identify possible errors for decoding.

In one or more embodiments, the method further comprises modulating pulses of the pulse power at the power sourcing equipment for use in transmitting control plane data to the powered device.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

With the growing need to provide cost effective power and data connectivity to the large number of end point devices that will be deployed in the future, Single Pair Ethernet (SPE) has emerged as a promising technology. SPE enables data transmission over Ethernet via a single pair of wires while also providing a power supply (e.g., Power over Data Line (PoDL)) to pass electrical power along with data to allow a single cable to provide both data connectivity and electrical power to end point devices. New Ethernet applications are planned for use with single pair copper cables in the Enterprise, industrial applications, automotive Ethernet, and IoT devices (e.g., sensors, actuators, appliances, vehicles, lighting, health care monitoring devices, traffic control, phones, video cameras, point-of-sale devices, security access control devices and systems, residential devices, building and home automation, energy management, manufacturing equipment, smart systems, 5G Wi-Fi, 5G cellular data, and many more applications).

Conventional Power over Ethernet (POE) or PoDL systems used to simultaneously transmit power and data communications over the same twisted pair cable are typically limited in range and power capacity. The maximum power delivery capacity of standard PoE is approximately 100 W (watts) and standard PoDL is approximately 50 W, but many classes of powered devices would benefit from power delivery over 100 W and in some cases up to 1000 W to 2000 W. In conventional systems, when larger power delivery ratings are needed, power is supplied to a remote device through a local power source. It is therefore desirable to increase the power available over cables using one or more balanced transmission pairs to hundreds and even thousands of watts. This capability may enable many new choices in network deployments where major devices such as workgroup routers, multi-socket servers, large displays, wireless access points, fog nodes, IoT devices, or other devices operated over cables using one or more balanced transmission pairs. This capability would greatly decrease installation complexity and improve the total cost of ownership of a much wider set of devices that have their power and data connectivity needs met from a central device.

In order to increase available power, high voltage pulses (referred to herein as pulse power) may be used. One example for delivering pulse power is described in U.S. patent application Ser. No. 15/971,729, filed May 4, 2018, entitled "High Power and Data Delivery in a Communications Network with Safety and Fault Protection", which is incorporated herein by reference in its entirety.

Pulse power may be delivered along with data over a single balanced copper wire pair. The wire pair may be located within a Single Pair Ethernet (SPE) cable or a multi-pair cable (e.g., two-pair cable, four-pair cable, or any other number of pairs). A problem that may occur with transmission of data with pulse power on a wire pair is that edges of high voltage pulses may corrupt Ethernet packets. Thus, a simple summing of the pulse power and data signals together may result in data corruption on the pulse power edges and the data frequency spectrum may be washed out during pulse power transitions.

The embodiments described herein provide for mitigation of corruption of data due to pulse edges during pulse power transition with transmission of data and pulse power on a wire pair. As described in detail below, the embodiments allow data transmission while avoiding potential interference that may be caused by the pulse power that is coupled onto the same pair of wires transmitting data. In one or more embodiments, a control circuit from the pulse power circuitry may hold the data during pulse power transitions at a transmitter. Data may also be marked for possible error at the receiver based on the pulse power transitions. In one or more embodiments, FEC (Forward Error Correction) may be added to the control circuit to minimize the window in which data is held and maximize the overall data rate. In one or more embodiments, modulation of the high voltage pulses may also be used in parallel with the SPE (or multi-wire pair) transmission for control plane data.

It is to be understood that the term "wire pair" as used herein may refer to a single wire pair (single twisted pair, single balanced copper wire pair, single wire pair Ethernet) located in a single pair cable (e.g., SPE, Base-T1 Ethernet) or a wire pair located in a multi-pair cable (e.g., two-pair cable, four-pair cable, Base-T Ethernet). The other wire pairs in a multi-pair cable may deliver data, power, data and power (PoE, PoDL), or data and pulse power as described herein. The multi-pair cable may comprise multiple instances of single wire pairs (e.g., SPE, PoDL) in parallel or multiple wire pairs connected between a pair center tap (e.g., PoE). A system for transmitting pulse power and data over a multi-pair cable comprising more than one wire pair configured to transmit data and pulse power may comprise more than one circuit or additional components described below with respect to FIGS. 4-10 to prevent data corruption during power transitions for each wire pair.

As described in detail below, various logic and circuits may be used to provide pulse power and data on a single wire pair while avoiding Ethernet corruption during the pulse power transition times due to the pulse power transition edges. The circuits may be used to avoid potential interference caused by the pulse power that is coupled on the same pair of wires as the data.

Referring now to the drawings and first to FIG. 1, an example of a network in which the embodiments described herein may be implemented is shown. PSE (Power Sourcing Equipment) 10 transmits pulse power and data to a plurality of PDs 12 on single wire pair cables 14. In one example, the cables 14 are referred to herein as SPE cables, however, as previously described, each of the single wire pair cables 14 may comprise an SPE cable or multi-pair cable comprising at least one single wire pair transmitting data and pulse power. For simplification, only a small number of nodes are shown. The embodiments operate in the context of a data communications network including multiple network devices. The network may include any number or arrangement of network devices in communication via any number of nodes (e.g., routers, switches, gateways, controllers, access points, or other network devices) operable to route (switch, forward) data communications and facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT) network, Internet, intranet, or any other network).

Signals may be exchanged among communications equipment and power transmitted from the power sourcing equipment 10 to powered devices 12. Data communications between the PSE 10 and PD 12 may be bidirectional (i.e., data transmitted from PSE to PD and from PD to PSE). The network is configured to pass electrical power along with data to provide both data connectivity and electrical power to network devices 12, which may include switches, routers, access points, IoT devices, or other electronic components and devices. The power may be transmitted from the PSE 10 to end points (PDs) 12, which may be located at distances up to 1000 m, for example, and at power levels greater than 50 W (e.g., 100 W, 250 W, 500 W, 1000 W, 2000 W or any other power level).

The PSE 10 is operable to receive external power and transmit power (e.g., pulse power, high voltage pulse power) over SPE cables 14 in the communications network. The PSE (power and data source) 10 may comprise a power supply unit (PSU) for receiving and distributing power and a network interface for receiving data (e.g., one or more fabric cards or line cards). The PSE 10 is operable to provide high capacity power from an internal power system (e.g., PSU capable of delivering power over and including 100 W (e.g., 1 kW or higher)) and driving the plurality of devices 12 each in the 50 W-2000 W range, or any other suitable power range. The PSE 10 may comprise, for example, a router, switch, convergence system, or any other suitable line card system or network device operable to transmit power and data.

One or more of the network devices 12 may also deliver power to equipment using PoE or PoDL. For example, one or more of the powered devices 12 may deliver power to electronic components such as IP (Internet Protocol) cameras, VOIP (Voice over IP) phones, video cameras, point-of-sale devices, security access control devices, residential devices, building automation devices, industrial automation devices, factory equipment, lights (building lights, street-lights), traffic signals, fog nodes, IoT devices, sensors, or other electrical components and devices. In one or more embodiments, a redundant PSE (not shown) may provide backup or additional power or bandwidth, as needed in the network. In one or more embodiments, there is no need for additional electrical wiring for the communications network and all of the network communications devices 12 operate using the power provided by the PSE 10 (or multiple PSEs).

The cable 14 is configured for single pair Ethernet and comprises two conductors (copper wires). SPE cables 14 extend from the PSE 10 to the PDs 12 and may be formed from any material suitable to carry both electrical power and data. The cables 14 may be connected to the network devices 10, 12 with a connector (connection, coupling, connector assembly) formed from a plug (also referred to as a male connector) and a receptacle (also referred to as a port, jack, receiver, or female connector) coupled together. The connection may be used for connecting communications equipment through cables 14 configured to carry both data and power. The connector may comprise, for example, a modified RJ-45 type connector or any other suitable connector. The SPE connector may be configured with a small form factor that allows for an increased number of ports as compared to conventional four-pair connectors.

The cable 14 may be configured according to a standard cable gauge and rated for one or more power or current levels, a maximum power level, a maximum temperature, or identified according to one or more categories indicating acceptable power level usage, for example. In one example, the cable 14 may correspond to a standardized wire gauge system such as AWG (American Wire Gauge). The cable 14 may comprise, for example, 18 AWG or other suitable size cable. For different gauge wire, AWG provides data including diameter, area, resistance per length, ampacity (maximum amount of current a conductor can carry before sustaining immediate or progressive deterioration), and fusing current (how much current it takes to melt a wire in free air). Various other standards (e.g., NEC (National Electrical Code), UL (Underwriters Laboratories)) may be used to provide various requirements for the cables and connectors and provide temperature or power ratings or limits, or other information.

The network may also include appropriate safety features as needed for higher power PoDL (e.g., insulation, process for power/cable compatibility confirmation, control circuit check for open/short, or thermal sensor). In one or more embodiments, the connector and cable 14 are configured to meet standard safety requirements for line-to-ground protection and line-to-line protection at relevant high voltage by means including clearance and creepage distances, and touch-safe techniques. The connector may comprise safety features, including, for example, short-pin for hot-plug and hot-unplug without current surge or interruption for connector arcing protection. The connector may further include additional insulation material for hot-plug and hot-unplug with current surge or interruption with arc-flash protection and reliability life with arcing. The insulated cable power connector terminals are preferably configured to meet touch voltage or current accessibility requirements.

In one or more embodiments, the network may incorporate safety features as described in U.S. patent application Ser. No. 15/971,729, referenced above. For example, the system may operate in a communications network with fault detection and safety protection (e.g., touch-safe fault protection). In one embodiment, fault sensing may be performed through a low voltage safety check combined with a digital interlock that uses the data system to provide feedback on the power system status and set a power operation mode. The fault sensing may be performed, for example, during a low voltage startup or between high power pulses in the pulse power system. The pulse power may comprise low voltage fault detection between high voltage power pulses, for example. Fault sensing may include, for example, line-to-line fault detection with low voltage sensing of the cable or powered device and line-to-ground fault detection with midpoint grounding. Touch-safe fault protection may also be provided through cable and connector designs that are touch-safe even with high voltage applied. The power safety features provide for safe system operation and installation and removal (disconnect) of components.

As described below, pulse power uses short pulses of high voltage power. In one or more embodiments, the signature of the pulse may be analyzed for each cycle. This analysis may be a rising edge, falling edge, or both. If the signature is corrupt by an unexpected load, the pulses may be stopped until it is determined that the load is safe to power. The signature may be corrupted, for example, by a human, short, or open.

It is to be understood that the safety features described above are only examples of safety or fault protection features that may be included for high voltage pulse power. Any combination of these or other safety features may be used with the embodiments described herein.

In one or more embodiments, the system may employ a dual-power mode that detects and negotiates between the power source 10 and powered device 12. This negotiation may, for example, distinguish between and accommodate different power-delivery schemes, such as standard PoDL, high power, pulse power, or other power modes. Standard PoDL distribution may be used for remote network devices rated less than about 50 W, for example. For higher power remote powered devices, pulse power may be used to create an efficient energy distribution network.

In one or more embodiments, 100 Mbps to 1000 Mbps data may be delivered over a distance of approximately 40 meters, 10 Gbps data may be delivered over a distance of approximately 15 meters, or 10 Mbps data may be delivered over a distance of approximately 1 km. For example, data may be transmitted at a rate of 1 Gbps at a distance up to 40 m in accordance with IEEE 802.3 bp or IEEE 802.3bw, data may be transmitted at 10 Mbps for a distance up to 1000 m in accordance with IEEE 8002.3cg, or data may be transmitted at 2.5 Gbps-10 Gbps over a distance up to 10 m or 15 m in accordance with IEEE 802.3ch. It is to be understood that these power levels and distances are provided only as examples and other power levels in combination with other distances may be used in accordance with the above referenced standards or any other applicable standard or future standard, without departing from the scope of the embodiments.

Furthermore, it is to be understood that the network devices and topology shown in FIG. 1 and described above is only an example and the embodiments described herein may be implemented in networks comprising different network topologies or network devices, without departing from the scope of the embodiments. For example, the network may comprise any number or type of network communications devices that facilitate passage of data over the network (e.g., routers, switches, gateways, controllers, access points), network elements that operate as endpoints or hosts (e.g., servers, virtual machines, clients, IoT devices), and any number of network sites or domains in communication with any number of networks. Thus, network nodes may be used in any suitable network topology, which may include any number of servers, virtual machines, switches, routers, or other nodes interconnected to form a large and complex network, which may include cloud or fog computing. Nodes may be coupled to other nodes or networks through one or more interfaces employing any suitable connection, which provides a viable pathway for electronic communications along with power.

Figure 2:
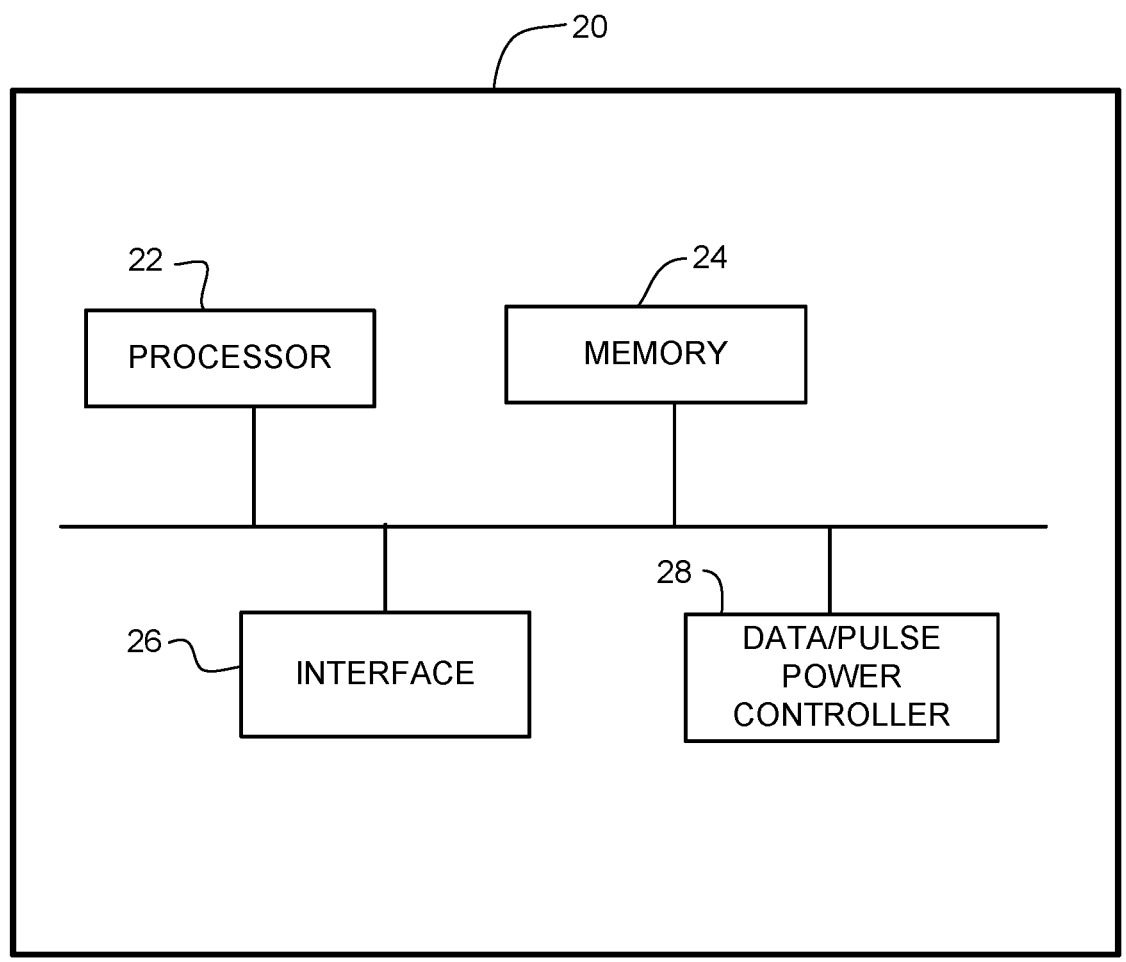
FIG. 2 depicts an example of a network device useful in implementing embodiments described herein.

FIG. 2 illustrates an example of a network device 20 (e.g., PSE 10, PD 12 in FIG. 1) that may be used to implement the embodiments described herein. In one embodiment, the network device 20 is a programmable machine that may be implemented in hardware, software, or any combination thereof. The network device 20 includes one or more processor 22, memory 24, interface 26, and data/pulse power controller 28.

Memory 24 may be a volatile memory or non-volatile storage, which stores various applications, operating systems, modules, and data for execution and use by the processor 22. For example, components of the controller 28 (e.g., code, logic, or firmware, etc.) may be stored in the memory 24. The network device 20 may include any number of memory components.

The network device 20 may include any number of processors 22 (e.g., single or multi-processor computing device or system), which may communicate with a forwarding engine or packet forwarder operable to process a packet or packet header. The processor 22 may receive instructions from a software application or module, which causes the processor to perform functions of one or more embodiments described herein. The processor 22 may also operate one or more components of the controller 28.

The data/pulse power controller 28 may comprise components (modules, gate, buffer, FEC block, packet marking/dropping block, encoder, decoder, error correcting code, software, logic) located at the PSE 10 or the PD 12, and interconnected through the combined power and data SPE cable 14 (FIGS. 1 and 2). As described below, the controller 28 may control data transmission or data processing (e.g., marking, dropping, decoding) based on power transitions at the pulse power. The controller 28 may also modulate pulses of the pulse power to transmit control plane data from the PSE to the PD.

Logic may be encoded in one or more tangible media for execution by the processor 22. For example, the processor 22 may execute codes stored in a computer-readable medium such as memory 24. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowcharts of FIGS. 11A, 11B, 11C, and 11D. The network device 20 may include any number of processors 22.

The interface 26 may comprise any number of network interfaces (line cards, ports, inline connectors (e.g., receptacle)) for transmitting or receiving power and transmitting and receiving data. The network interface may be configured to transmit or receive data using a variety of different communications protocols and may include mechanical, electrical, and signaling circuitry for communicating data over physical links coupled to the network interfaces. For example, line cards may include port processors and port processor controllers. One or more of the interfaces 26 may be configured for PoDL on SPE or PoE on multi-pair cable.

It is to be understood that the network device 20 shown in FIG. 2 and described above is only an example and that different configurations of network devices may be used. For example, the network device 20 may further include any suitable combination of hardware, software, algorithms, processors, devices, components, or elements operable to facilitate the capabilities described herein.

Figure 3:
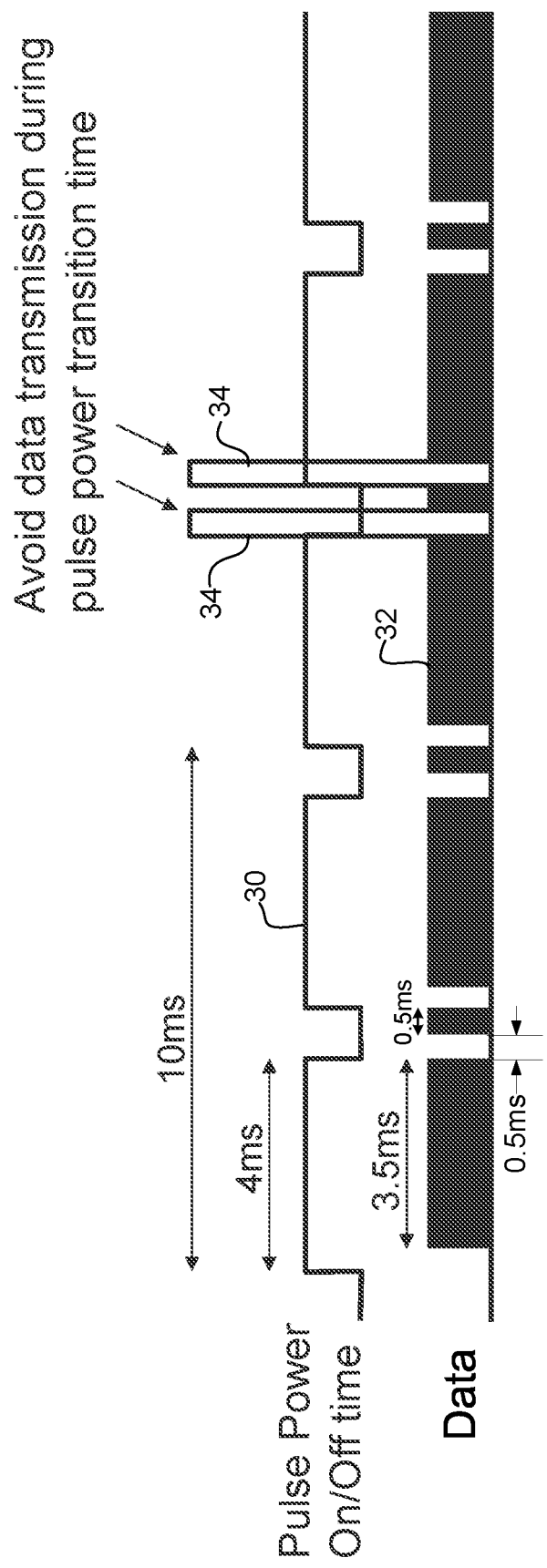
FIG. 3 illustrates an example of pulse power and data transmission with avoidance of data transmission during pulse power transition time.

FIG. 3 illustrates an example of a pulse power on/off cycle with data transmittal (e.g., 10 Mbps data (or any other data rate)). In this example, a pulse power cycle comprises 4 ms power on and 1 ms power off. It is to be understood that the power duty cycle shown in FIG. 3 is only an example and that different power on or power off timing may be used without departing from the scope of the embodiments. Also, it should be noted that power transitions (from power on to power off or from power off to power on) may occur over a period of time (i.e., rising or falling slope or curve). As previously described, edges of pulse power signal 30 during pulse power transitions 34 (time period covering a transition from power on to power off or from power off to power on) may impact data signal 32. In one example, data transfer may be suspended during the pulse power transitions 34. In the example shown in FIG. 3, the power pulse transition 34 covers a 0.5 ms time period. Holding off (suspending) data transmission during this transition period provides a clear distinction between power and data, thereby providing the pulse circuitry a reliable method to determine faults, while eliminating application of significant coding and signaling to the data stream. As shown in the example of FIG. 3, data is transmitted for 3.5 ms, suspended (stopped, held) for 0.5 ms, resumed for 0.5 ms, and suspended for 0.5 ms. This cycle is repeated to avoid data transmission during the pulse power transition times. Examples of circuits that may be used to avoid data transmission during the pulse power transitions are shown in FIGS. 4 and 5, and described below.

Figure 4:
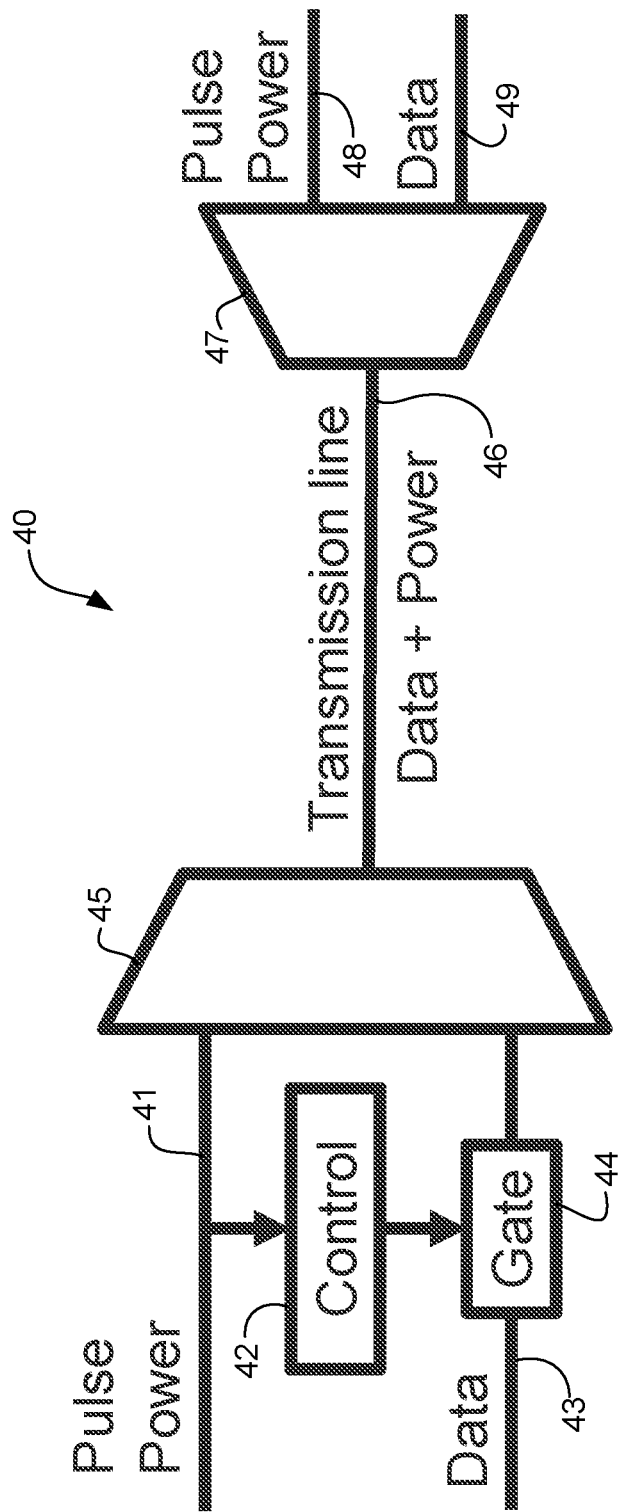
FIG. 4 is a schematic of a system for delivering pulse power and data on a single wire pair with use of pulse power transition edges to control data transmission at a transmitter, in accordance with one embodiment.

FIG. 4 illustrates an example of a system, generally indicated at 40, that may be used to hold off data transmissions during periods of potential corruption (e.g., pulse power transition time periods 34 shown in FIG. 3), in accordance with one embodiment. Pulse power and data are provided at lines 41, 43 to transmitter (multiplexer) 45 and transmitted over a single wire pair 46 (e.g., SPE cable, multi-pair cable) to receiver (demultiplexer) 47 connected to pulse power line 48 and data line 49. The pulse power and data input lines 41, 43 and transmitter 45 are located at the PSE 10 in FIG. 1, and the receiver 47 and pulse power and data output lines 48, 49 are located at the PD 12. Transmission line 46 represents the cable 14 in FIG. 1 (e.g., SPE cable, multi-pair cable). The block 45 is referred to as a multiplexer/transmitter at a transmitting end (e.g., PSE 10 in FIG. 1) and the block 47 is referred to as a demultiplexer/receiver at a receiving end (e.g., PD 12 in FIG. 1). It is to be understood that data on line 49 may also be transmitted from the PD 12 to the PSE 10 on the cable 14 (FIGS. 1 and 4).

In this example, pulse power edges are used to control a buffer for the data through control block 42 providing input to gate 44. Since the PSE generates the data and the pulse power, the data transmitter has direct access to the power signal timing. The controller 42 holds off transmission of data at data input 43 during pulse power transition times. For example, referring to the power and data duty cycle shown in FIG. 3, as the pulse power transitions to off, the controller 42 instructs the gate 44 to buffer data for 0.5 ms. Data is then transmitted for 0.5 ms while the power is off and is then held back (suspended) for another 0.5 ms while the power cycles to on. As previously noted, the data timing cycle shown in FIG. 3 is only an example and different timing may be used, without departing from the scope of the embodiments. For example, power may be cycled on or off for a different time period and the length of time for which the data is buffered during the pulse power transition time may be different than 0.5 ms.

Figure 5:
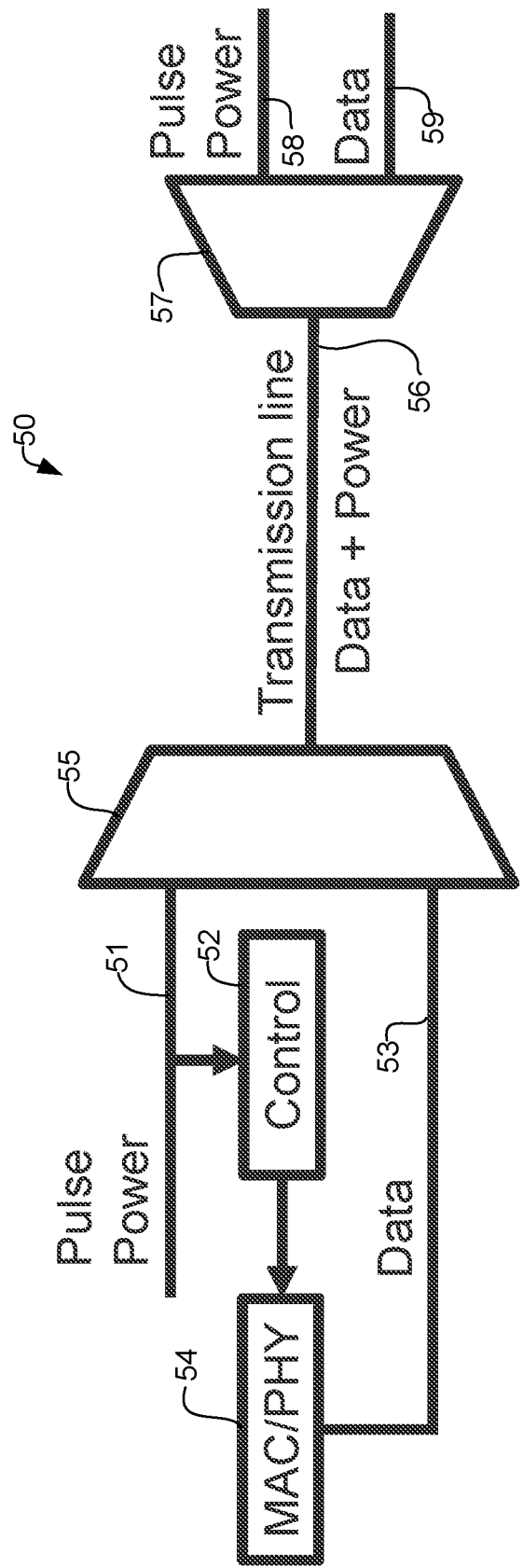
FIG. 5 is a schematic of a system for delivering pulse power and data on the single wire pair with use of pulse power transition edges to control a MAC/PHY to hold off data transmission at the transmitter, in accordance with one embodiment.

FIG. 5 illustrates a system, generally indicated at 50, for controlling data transmission for use with pulse power, in accordance with one embodiment. Pulse power line 51 provides input to control block 52, which controls MAC (Media Access Control)/PHY (Physical layer entity) block 54 to hold off data transmission during pulse power transition edges. The PHY block 54 contains functions that transmit, receive, and manage encoded signals that are impressed on and recovered from the physical medium. Pulse power at line 51 and data at line 53 are input at block (multiplexer) 55 and transmitted over transmission line 56 to block (demultiplexer) 57 connected to pulse power line 58 and data line 59. Components 51, 52, 53, 54, and 55 are located at the PSE 10 and components 57, 58, and 59 are located at the PD 12 in FIG. 1. Referring again to the power and data duty cycle shown in FIG. 3, as the pulse power transitions to off, the controller 52 instructs the MAC/PHY block 54 to buffer data for 0.5 ms. Data is then transmitted for 0.5 ms while the power is off and once again suspended for another 0.5 ms while the power cycles to on. As previously noted, different power duty cycles may be used without departing from the scope of the embodiments.

Figure 6:
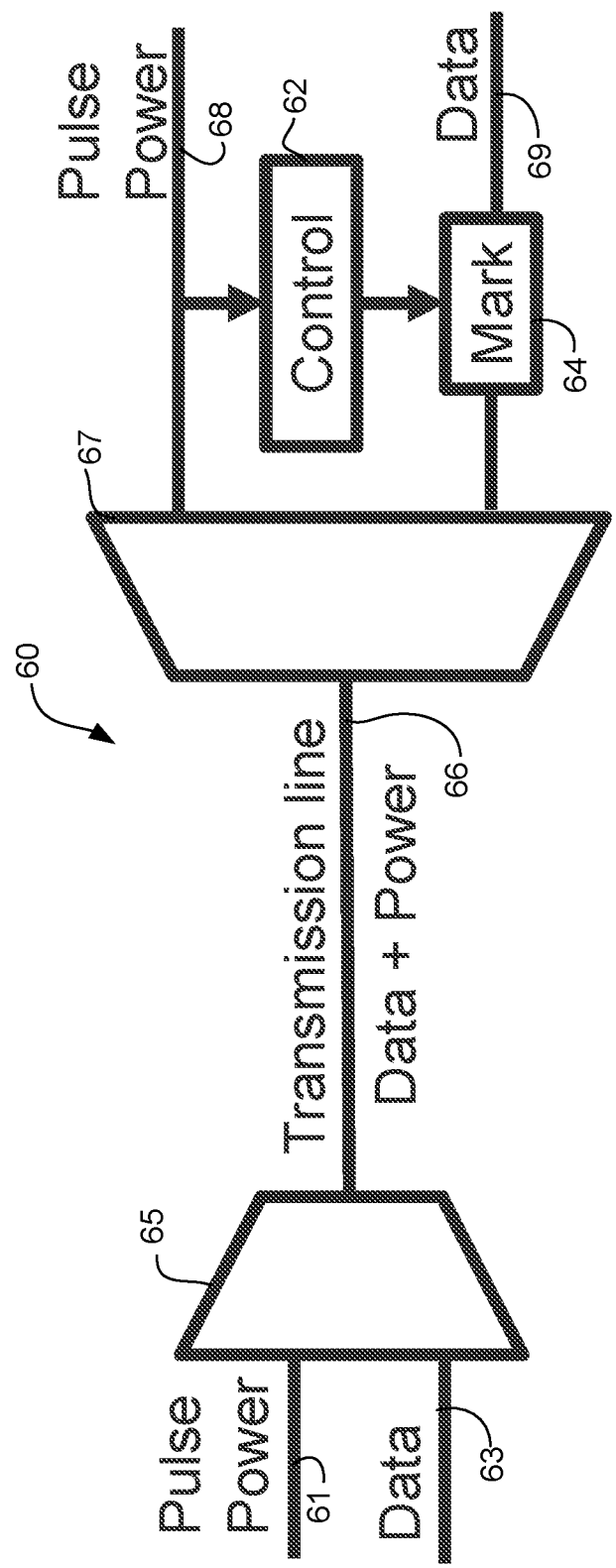
FIG. 6 is a schematic of a system for delivering pulse power and data on the single wire pair with use of pulse power transition edges to mark packets for possible error at a receiver, in accordance with one embodiment.
Figure 7:
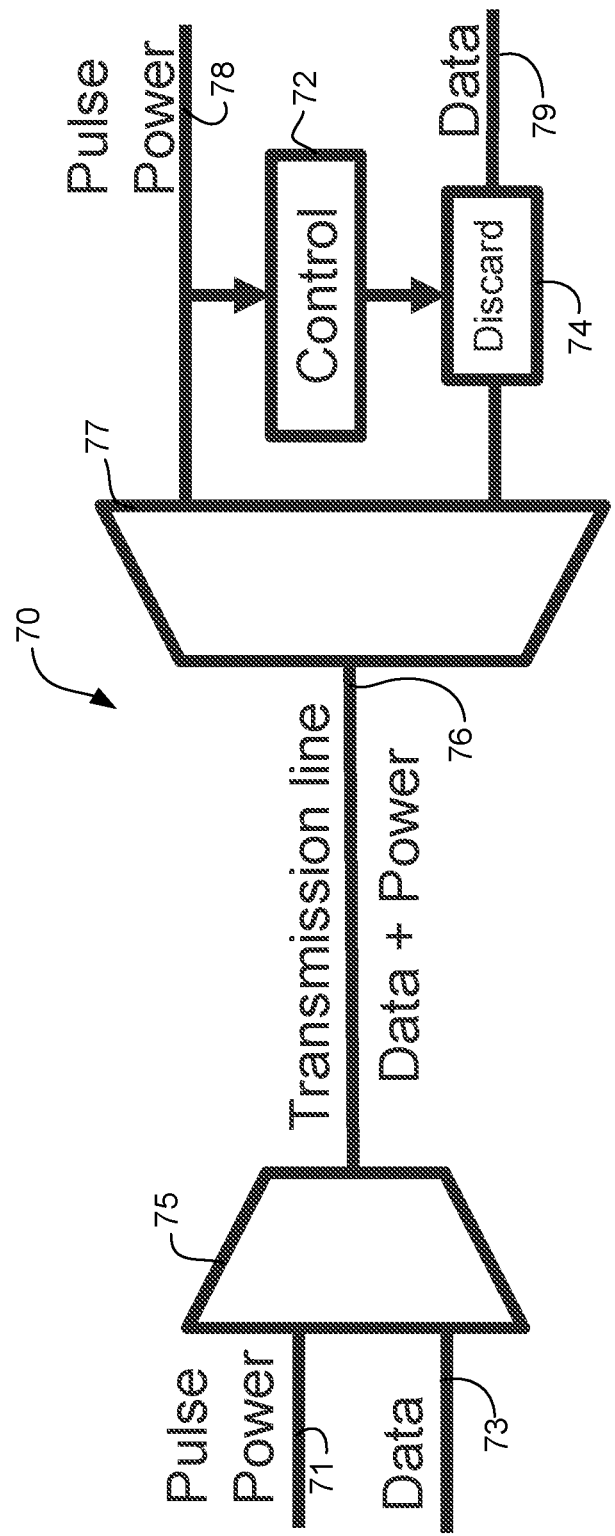
FIG. 7 is a schematic of a system for delivering pulse power and data on the single wire pair with use of pulse power transition edges to mark packets for discard at the receiver, in accordance with one embodiment.

FIGS. 6 and 7 show examples of systems 60, 70, respectively, in which pulse power transitions are used to control data at the receiving end (e.g., PD 12 in FIG. 1). As described in detail below, pulse power transition edges may be used to mark packets, which may be dropped or retried (retransmission request).

FIG. 6 illustrates a system, generally indicated at 60, operable to use pulse power transition edges at pulse power line 68 at receiver (demultiplexer) 67 to mark data for errors at data line 69, in accordance with one embodiment. Pulse power is received at line 61 and data is received at line 63 at transmitter (multiplexer) 65 and transmitted over single wire pair 66 to the receiver 67 (e.g., PD 12). A controller 62 uses the pulse power transition edges to mark packets for possible error at block 64. Packets marked for error may be dropped, depending on the number of bit errors or requested to be retried based on packet type, for example.

FIG. 7 illustrates a system, generally indicated at 70, operable to use pulse power transition edges to mark data for discard at data line 79, in accordance with one embodiment. Pulse power is received at line 71 and data is received at line 73 at transmitter 75 (e.g., PSE 10 in FIG. 1) and transmitted over single wire pair 76 to the receiver 77 (e.g., PD 12 in FIG. 1). Controller 72 marks packets to drop at block 74 on the data line 79 at the receiver based on the pulse power transition times. In this example, all packets are dropped at discard block 74 during the pulse power transitions. Client recovery may be needed on each side of the line to prevent data quality issues.

Figure 8:
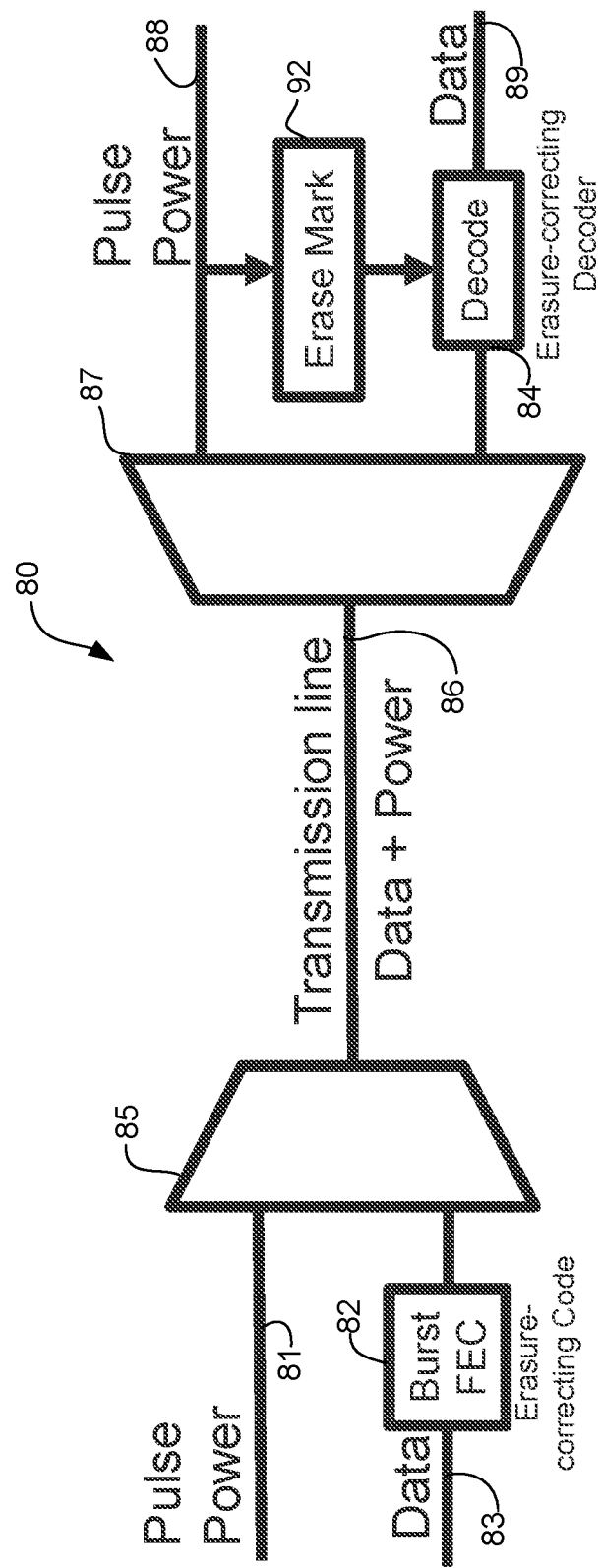
FIG. 8 is a schematic of a system for delivering pulse power and data on the single wire pair with use of pulse power transition edges to mark data for possible error at the receiver for use with FEC (Forward Error Correction), in accordance with one embodiment.
Figure 9:
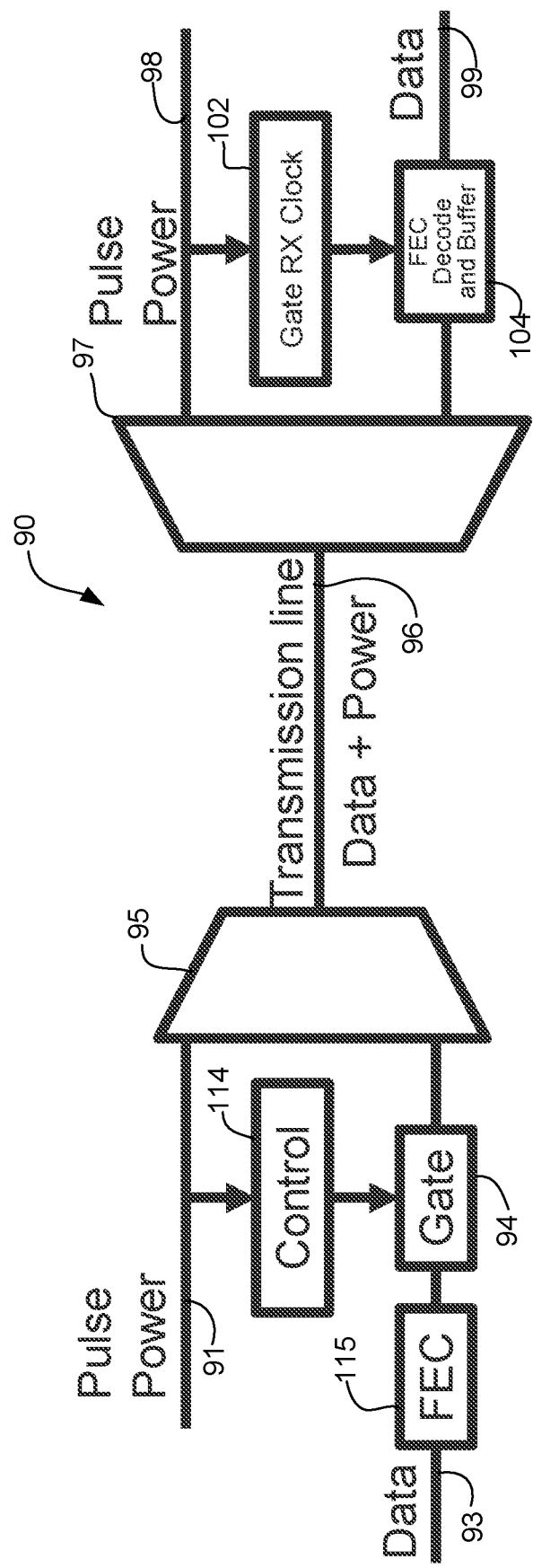
FIG. 9 is a schematic of a system for delivering pulse power and data on the single wire pair with use of pulse power transition edges to control data transmission at the transmitter and a buffer and FEC decoder at the receiver, in accordance with one embodiment.
Figure 10:
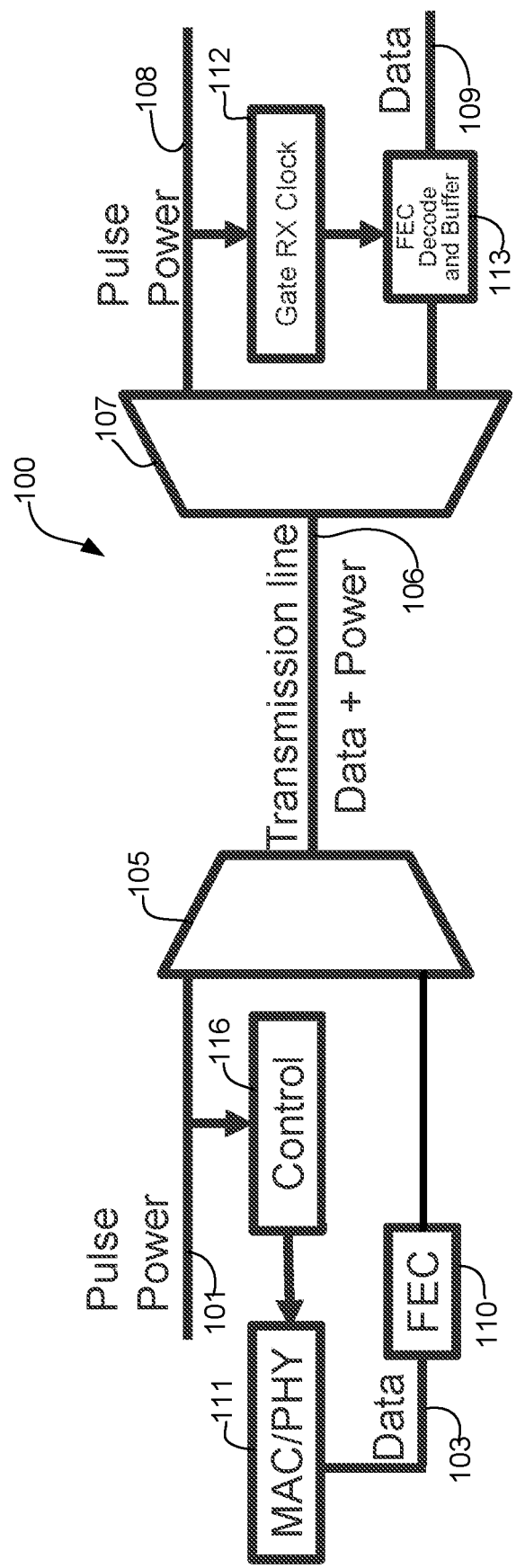
FIG. 10 is a schematic of a system for delivering pulse power and data on the single wire pair with use of pulse power transition edges to control the MAC/PHY to hold off data transmission at the transmitter and a buffer and FEC decoder at the receiver, in accordance with one embodiment.

FIGS. 8, 9, and 10 illustrate systems 80, 90, and 100, respectively, which use locations of the pulse power transitions to indicate the location of possible errors in the data. FEC (Forward Error Correction) may be used to correct errors in the data identified as being received during pulse power transitions (FIG. 8) or for use on data that is not held off during pulse power transitions when used in combination with suspending data during pulse power transitions at the PSE (FIGS. 9 and 10). The FEC may utilize any suitable error correcting code to control errors in the data transmission (e.g., Reed-Solomon or any other suitable code). The error correcting code provides redundancy, which allows the receiver to detect errors and correct errors without retransmission. In one or more embodiments, the data may be encoded with an erasure correcting code at the PSE 10 using burst FEC and encoded at the PD 12, as described below with respect to FIG. 8.

FIG. 8 illustrates a system, generally indicated at 80, for use in marking the location of symbols likely to be in error for an erasure-correcting decoder 84 at the PD, in accordance with one embodiment. Pulse power is received at line 81 and data at line 83 at multiplexer 85. FEC (e.g., burst FEC erasure-correcting code) is applied at block 82. The data and power are transmitted on SPE transmission line 86 to receiver (demultiplexer) 87. Locations of the pulse power transitions on power line 88 are used to mark the location of symbols likely to be in error at block 92. The erasure-correcting decoder 84 decodes the marked data at data line 89. This may increase the number of errors that can be corrected by a factor of two, for example, and may significantly reduce the number of packet drops or retries.

FIG. 9 illustrates a system, generally indicated at 90, in which data transmission is gated based on pulse power transitions (as described above with respect to FIG. 4) and FEC is used to protect the remaining data. The pulse power at line 91 is used to indicate pulse power transitions at controller 114, which provides input at gate 94 to hold the data during the pulse power transitions. FEC block 115 at the PSE is used along with decoder 104 at the PD to protect the remaining data transmitted at 95 on single wire pair 96 and received at multiplexer 97. The order of the gate 94 and FEC block 115 may be interchanged at the transmitter. At the receiver, pulse power line 98 provides input at a gate receiver clock 102, which provides input to FEC decode and buffer 104 on data line 99. In contrast to the system 80 shown in FIG. 8, the receiver in the system 90 is only gating the received signal to reassemble the sequence (hence the buffer). It is not declaring erasure locations to aid the decoder.

FIG. 10 illustrates a system, generally indicated at 100, that combines the control of data at the transmitter as described above with respect to FIG. 5 with the FEC of FIG. 9, in accordance with one embodiment. Data transmission on data line 103 is controlled at MAC/PHY 111 based on pulse power transitions (as described above with respect to FIG. 5) and FEC 110 is used to protect the remaining data (as described above with respect to FIG. 9). The pulse power at line 101 is used to indicate pulse power transitions at controller 116, which provides input at MAC/PHY 111 to hold the data based on the pulse power transitions. FEC block 110 protects the remaining data transmitted at multiplexer 105. The data and power are transmitted on single wire pair 106 and received at demultiplexer 107. At the receiver, pulse power line 108 provides input at a gate receiver clock 112, which provides input to FEC decode and buffer block 113 on data line 109. As previously noted, the receiver is only gating the received signal to reassemble the sequence and is not declaring erasure locations to aid the decoder.

In one or more embodiments, an error rate on the FEC block receiver 104, 113 (FIGS. 9 and 10) may be used to indicate that there may be a fault in the wire. For example, an increase in FEC errors may indicate an issue with the wire in which case pulse power should be shut down (or the power changed to a lower setting). The PD 12 may provide information on FEC errors to the PSE 10 (FIG. 1) over bidirectional communications cable 14.

It is to be understood that the systems 40, 50, 60, 70, 80, 90, and 100 shown in FIGS. 4-10 are only examples and components may be added, removed, modified, or combined without departing from the scope of the embodiments. Also, it is to be understood that the term "controller" as used herein may refer to one or more components used to mitigate data errors during pulse power transitions at the PSE 10, PD 12, or both ends of the single wire pair. For example, a controller at the PSE may include control block 42 and gate 44 (FIG. 4) or control block 116 and FEC block 110 (FIG. 10). A controller at the PD may include, for example, the control block 62, 72 and mark or discard block 64, 74 (FIGS. 6 and 7) or the gate receiver clock 112 and FEC decoder/buffer 113 (FIG. 10) or any subset or combination of these components.

Also, as previously noted, pulse power and data may be transmitted over any number of wire pairs. Each wire pair transmitting pulse power and data may be associated with a circuit such as shown in FIGS. 4-10 to mitigate data corruption during pulse power transitions. One or more circuit components may be shared between wire pairs if pulse power is transmitted in a phantom power scheme (e.g., using a center tap such as in PoE).

FIGS. 11A-11D are flowcharts illustrating an overview of processes for transmitting and receiving pulse power and data over SPE, in accordance with one or more embodiments.

Figure 11A:
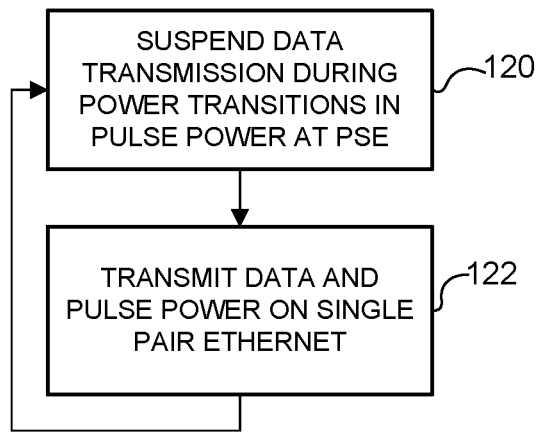
FIG. 11A is a flowchart illustrating an overview of a process for transmitting pulse power and data on the single wire pair with control of data transmission at power sourcing equipment, in accordance with one embodiment.

Referring first to the flowchart of FIG. 11A, data transmission is controlled based on pulse power transmission timing at the PSE. At step 120, data transmission is suspended during power transitions on pulse power at the PSE. For example, a controller (e.g., control block 42 and gate 44 in FIG. 4, control block 52 and MAC/PHY 54 in FIG. 5) may suspend transmission of data at the power sourcing equipment during identified power transitions (e.g., 0.5 ms period 34 shown in FIG. 3). Data and pulse power are transmitted on the cable 14 to the powered device 12 (step 122) (FIGS. 1 and 11A).

Figure 11B:
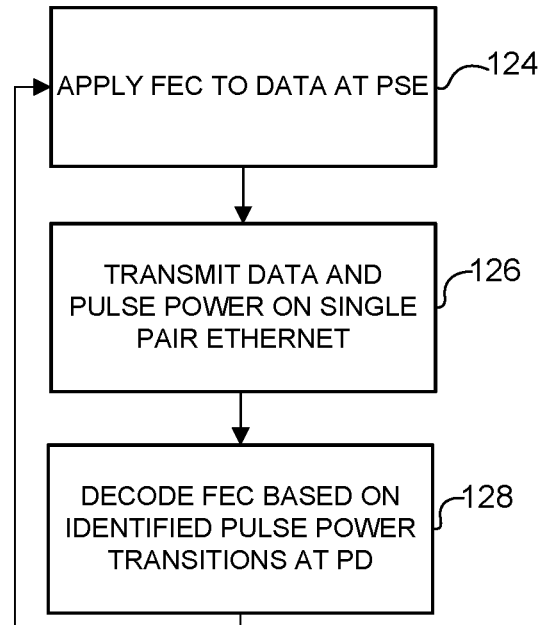
FIG. 11B is a flowchart illustrating an overview of a process for transmitting pulse power and data on the single wire pair with FEC, in accordance with one embodiment.

FIG. 11B illustrates a process for using FEC to mitigate corruption of Ethernet packets (data transmission) during pulse power transitions, in accordance with one embodiment. FEC is applied to data at the PSE 10 (step 124) (FIGS. 1 and 11B). The data and pulse power are transmitted over the cable 14 to the powered device 12 (step 126). The power transitions are identified in the pulse power at the powered device 12 and data is decoded at the powered device based on the identified power transitions (step 128). For example, data transmitted during the pulse power transitions may be decoded to identify possible error as described above with respect to FIG. 8. FEC may also be used to protect data that is not suspended during pulse power transitions at the PSE (remaining data), as described above with respect to FIGS. 9 and 10.

Figure 11C:
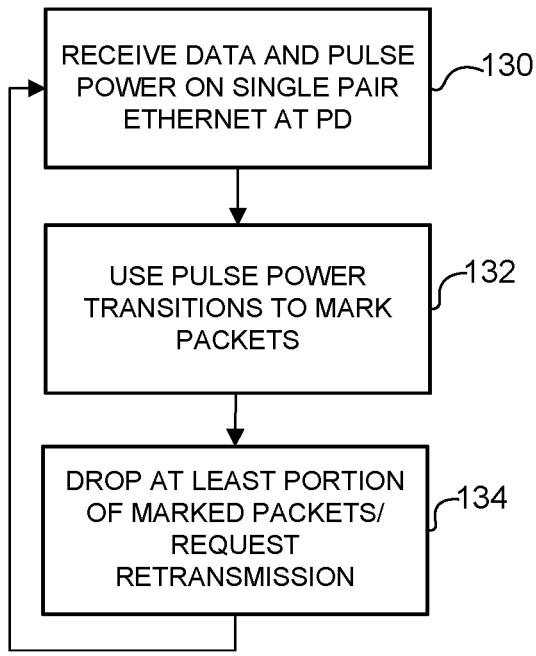
FIG. 11C is a flowchart illustrating an overview of a process for transmitting pulse power and data on the single wire pair with marking of packets at a powered device, in accordance with one embodiment.

FIG. 11C illustrates a process at the powered device for mitigating corruption of data during power transitions, in accordance with one embodiment. At step 130, data and pulse power are received on the cable 14 at the powered device 12 (FIGS. 1 and 11C). Pulse power transitions are used to mark packets for possible error (step 132). A portion of the marked packets may be dropped or retransmitted or all of the marked packets may be dropped, as described above with respect to FIGS. 6 and 7 (step 134).

Figure 11D:
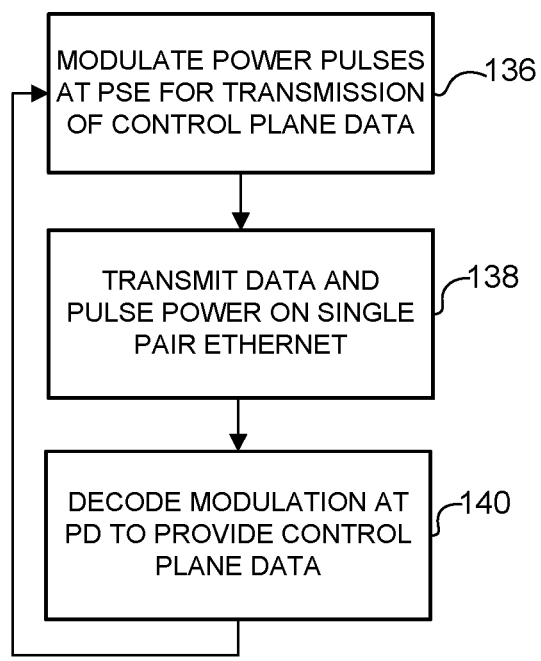
FIG. 11D is a flowchart illustrating an overview of a process for modulation of the pulse power for use in transmitting control plane data.

In one or more embodiments, modulation of the high voltage pulse power may be used in parallel with the SPE transmission for control plane data. For example, encode modulation may be added at the transmitter end with decoding at the receiver used to transmit control plane data. This would include the addition of decode components at the receiver end for the control plane data. FIG. 11D is a flowchart illustrating an overview of a process for transmitting control plane data, in accordance with one embodiment. At step 136, power pulses are modulated at the PSE to provide control plane data. The data and pulse power are transmitted on the cable with the control plane data superimposed on the power signal (step 138). The modulated power pulses are decoded at the powered device to provide the control plane data to the powered device (step 140). Any type of suitable modulation may be used (e.g., PWM (Pulse Width Modulation), NRZ (Non-Return to Zero), or other modulation).

It is to be understood that the processes shown in FIGS. 11A-11D and described above are only examples and steps may be added, removed, modified, or combined without departing from the scope of the embodiments. For example, one or more of the steps of the processes shown in FIGS. 11A, 11B, 11C, and 11D may be combined with one or more steps from another of the processes shown in a different flowchart. Also, as noted above, the cable may comprise a multi-pair cable and the process may be performed on one or more wire pairs. As previously described, FEC shown in steps 124-128 of FIG. 11B may be added to the process shown in FIG. 11A.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A method comprising:
   applying Forward Error Correction (FEC) to data at a power transmitter;
   transmitting the data and power over a wire pair to a power receiver;
   applying FEC decoding to at least a portion of the data received at the power receiver;
   deriving an error rate based on the FEC decoding;
   generating an indication of a power fault on the wire pair based on the error rate;
   determining whether to shut down or adjust the power based on the indication of the power fault together with information available to the power transmitter and/or power receiver; and
   shutting down the power or adjusting a power setting of the power at the power transmitter based on the determining.

2. The method of claim 1, wherein the information available to the power transmitter and/or power receiver includes information obtained from fault sensing on the wire pair.

3. The method of claim 1, further comprising transmitting from the power receiver to the power transmitter the indication of the power fault on the wire pair based on the error rate.

4. The method of claim 1, wherein the power is pulse power.

5. The method of claim 4, further comprising modulating pulses of the pulse power at the power transmitter for use in transmitting control plane data to the power receiver.

6. The method of claim 4, wherein the pulse power comprises a pulse power on time comprising a high power state and a pulse power off time comprising a low power state.

7. The method of claim 6, wherein the data is transmitted during pulse power on times.

8. The method of claim 1, further comprising suspending transmission of the data during power transitions at the power transmitter, buffering the data transmitted during said power transitions at the power receiver, and decoding FEC encoded data for remaining data.

9. An apparatus comprising:
   an interface for receiving power and data from a power source device over a wire pair, the data having been Forward Error correction (FEC) encoded; and
   a controller coupled to the interface, the controller configured to perform operations including:
      applying FEC decoding to at least a portion of data received via the interface;
      determining an error rate based on the FEC decoding;
      generating an indication of a power fault on the wire pair based on the error rate;
      obtaining information from fault sensing on the wire pair; and
      transmitting to the power source device the indication of the power fault and the information from fault sensing.

10. The apparatus of claim 9, wherein the indication of the power fault and information from fault sensing cause the power source device to shut down the power or adjust a power setting of the power at the power source device.

11. The apparatus of claim 9, wherein the controller is configured to buffer data transmitted during power transitions and decode FEC encoded data for remaining data.

12. The apparatus of claim 9, wherein the power is pulse power and pulses of the pulse power are modulated at the power source device for transmitting control plane data to the apparatus.

13. The apparatus of claim 12, wherein the pulse power comprises a pulse power on time having a high power state and a pulse power off time having a low power state.

14. The apparatus of claim 13, wherein the controller is further configured to perform the fault sensing between pulse power on times.

15. The apparatus of claim 13, wherein the data is transmitted during pulse power on times.

16. A system comprising:
   a first device that transmits data and power and applies Forward Error Correction (FEC) encoding to the data;
   a second device that receives the data and the power from first device over a wire pair; and
   a controller at the second device, the controller configured to perform operations including:

applying FEC decoding to at least a portion of data received;
determining an error rate based on the FEC decoding;
generating an indication of a power fault on the wire pair based on the error rate;
obtaining information from fault sensing on the wire pair; and
transmitting to the first device the indication of the power fault and the information from fault sensing.

17. The system of claim 16, wherein the power is pulse power.

18. The system of claim 17, wherein the first device is configured to modulate pulses of the pulse power for transmitting control plane data to the second device.

19. The system of claim 17, wherein the pulse power comprises a pulse power on time having a high power state and a pulse power off time having a low power state.

20. The system of claim 16, wherein the first device is configured to shut down the power or adjust a power setting of the power based on the indication of the power fault and the information from fault sensing.

* * * * *